(12) United States Patent
Liu

(10) Patent No.: US 12,113,519 B2
(45) Date of Patent: Oct. 8, 2024

(54) LARGE-CURRENT MOS DRIVE CONTROL METHOD

(71) Applicant: SHENZHEN SOUTHKING TECHNOLOGY CO., LTD., Guangdong (CN)

(72) Inventor: Xianxi Liu, Guangdong (CN)

(*) Notice: Subject to any disclaimer, the term of this patent is extended or adjusted under 35 U.S.C. 154(b) by 156 days.

(21) Appl. No.: 17/624,342

(22) PCT Filed: Dec. 8, 2020

(86) PCT No.: PCT/CN2020/134496
§ 371 (c)(1),
(2) Date: Jan. 1, 2022

(87) PCT Pub. No.: WO2021/129376
PCT Pub. Date: Jul. 1, 2021

(65) Prior Publication Data
US 2022/0321115 A1 Oct. 6, 2022

(30) Foreign Application Priority Data
Dec. 27, 2019 (CN) .......................... 201911375597.7

(51) Int. Cl.
*H03K 17/082* (2006.01)
*H02M 1/32* (2007.01)
*H03K 17/18* (2006.01)
*H03K 17/08* (2006.01)

(52) U.S. Cl.
CPC ........ *H03K 17/0822* (2013.01); *H02M 1/327* (2021.05); *H03K 17/18* (2013.01); *H03K 2017/0806* (2013.01); *H03K 2217/0027* (2013.01)

(58) Field of Classification Search
None
See application file for complete search history.

(56) References Cited

U.S. PATENT DOCUMENTS

2013/0119908 A1* 5/2013 Harada ................ B62D 5/0406
318/400.42
2017/0033555 A1* 2/2017 Taguchi ........... H03K 17/08104

* cited by examiner

*Primary Examiner* — John F Mortell
(74) *Attorney, Agent, or Firm* — Xia Li

(57) ABSTRACT

A large-current MOS drive control method, comprising the following steps: 1) turning on a device, initializing the device, activating an MOS switching circuit, and completing a turn-on operation for the circuit; 2) monitoring the voltage connected to the switching circuit, connecting the switching circuit to a power supply after voltage detection, and activating the power supply; 3) connecting the power supply to a control circuit, processing, by the control circuit, information transmitted by the power supply, and driving, by the control circuit, a driving circuit; and 4) after the MOS switching circuit is connected, measuring the temperature of the switching circuit in real time by means of an infrared temperature measurement instrument, and if the temperature exceeds 80 Celsius degrees, giving an alarm by flashing a red alarm lamp.

5 Claims, 2 Drawing Sheets

LARGE-CURRENT MOS DRIVE CONTROL METHOD

TECHNICAL FIELD

The present disclosure relates to the field of large-current control procedures, more particularly, to a large-current MOS drive control method.

BACKGROUND ART

MOS transistor is an abbreviation of MOSFET. MOSFET (metal-oxide semiconductor field effect transistor), is characterized as having high input impedance, low noise, and good thermal stability; it also has simple manufacturing process and strong radiation, so it is usually used in an amplifying circuit or a switching circuit. As is well know, the advantage of MOS transistors is voltage-driven semiconductor, which consumes very little current during turning-on and turning-off, and the turn-on internal resistance Rds(on) is quite low, mostly below 10 milliohms, and some have been achieved below 1 milliohm, and thus choosing a MOS transistor for switch control is a good solution.

However, the existing large-current control system cannot simultaneously protect against high-temperature faults such as turn-on, turn-off, reverse connection, and short-circuit. For this reason, a large-current MOS drive control method has been invented to solve the above-mentioned problems.

SUMMARY

In order to overcome the shortcomings of the prior art, the present disclosure uses a single-chip microcomputer to control the switch of the MOS transistor, and other auxiliary circuits detect the current and voltage of the circuit to make corresponding control.

The above-mentioned technical purpose of the present disclosure is achieved through the following technical solutions:

The large-current MOS drive control method includes the following control procedures, including a detection module, a control module, and a display module.

Further, the detection module includes an ammeter, a voltmeter, a multimeter and an infrared thermometer. The ammeter is used to monitor the current in the drive switch; the voltmeter is used to measure the voltage entering the drive switch and select the corresponding control program; the multimeter monitors the battery polarity in the control circuit, the infrared thermometer monitors the temperature of the key connection points in the switching circuit, and collects and transmits the detection signal through numerous detection devices to the processor for signal processing, and transmits the processed information to the switching circuit.

Further, the display module includes a display panel, and the display panel is provided with a red fault light and a green working light.

The large-current MOS drive control method includes the following steps:
1) first turning on a device, initializing the device, activating an MOS switching circuit to make it in working state, turning on all the detection devices, and conducting a comprehensive monitoring of the switching circuit; at this time, after entering, there are red fault light and green work light on the display pane in flashing state; the red fault light and the green working light flash in turns to represent the search responsible state; the red fault light is turned off after 10 seconds, and the green working light is turned on to indicate the completion of the initialization operation, and finish the circuit opening operation;
2) first monitoring the voltage connected to the switching circuit, the large-current MOS drives the control circuit, the current range is 1000 A-3000 A; after the switching circuit passes the voltage detection, it is connected to the power supply to activate the power supply, and the power supply supplies power;
3) the power supply described in step 2) is connected to the control circuit; the control circuit processes the information transmitted by the power supply, and the control circuit drives the driving circuit, so that the high-voltage current can be converted to ensure device stability and improve use safety;
4) in step 3), after the MOS switching circuit is turned on, the temperature of the switching circuit is detected in real time by an infrared thermometer; if the temperature exceeds 80 degrees Celsius, giving an alarm by flashing a red alarm lamp; high temperature fault is displayed, and the signal is transmitted to the processor in the control circuit.

Further, in operation step 2, during the fault state, the LED connected to pin 28 needs to be set to high level to light up, and the I_ADC pin is checked again; if the detected value is greater than the current battery voltage, it means that there is fault, and the red fault light flashes; if the detected value is less than the value of the battery voltage, first turning on the TL1 advanced interrupt, and then turning on the ON/OFF pin. After they are turned on, if the TL1 interrupt is entered immediately, the ON/OFF will be turned off immediately in the interrupt and a fault alarm will be displayed. If the TL1 interrupt is not entered immediately, turn off the TL1 interrupt, and then check the ADC of the ILoad pin; if there is a value, turning on the green work light; if there is no value, turning off the ON/OFF, the red fault light and the green work light flash in turns, and executing again; if ILoad detects there is a value, judging the value; the value of this pin may exceed the detection range of the single-chip microcomputer; if it exceeds the range, the ADC value of the I_ADC pin can be detected, and it is not amplified (this value needs to be actually tested for current-limiting protection).

Further, in operation step 3, the driving circuit is used to control the MOS switching circuit, through the MOS transistors arranged in the switching circuit, the multiple MOS transistors are connected in parallel for application, so that the large current is shared by the multiple MOS transistors, and the current borne by a single MOS transistor is relatively small.

Further, in operation step 4, the switching circuit is adjusted by the driving circuit to reduce the power, thereby detecting temperature drop, which is used to protect the circuit and improve the safety. If the adjustment effect is not good, the high temperature failure persists, the MOS switching circuit is turned off by the control the circuit for maintenance and troubleshooting to ensure safety.

Further, in step 3, after the large-current circuit is converted by the MOS switching circuit, the converted current is monitored in real time by the ammeter to avoid damaging the subsequent circuit elements caused by the converted current overload, and improve the use stability of the subsequent equipment.

Further, in step 3, after the large-current circuit is converted by the MOS switching circuit, the MOS switching circuit is connected to the subsequent electrical equipment, and the power supply polarity of the control circuit is detected in real time through a multimeter to avoid subsequent power failure caused by reverse connection of the power supply.

In summary, the present disclosure has the following advantageous effects:
1. This process solves the large-current control system, realizes the opening and closing functions, and protects against reverse connection faults, high-temperature faults and short-circuits, and enhances the safety of large-current driving circuits;
2. It adjusts the switching circuit through the driving circuit to reduce power, so as to detect temperature drop, which is used to protect the circuit and improve safety. If the adjustment effect is not good and the high temperature failure persists, the MOS switching circuit is turned off through the control circuit, to perform overhaul and troubleshoot, and ensure safety;
3. The switching circuit is monitored by a thermometer to protect the circuit and improve safety. If the adjustment effect is not good and the high temperature failure persists, the MOS switching circuit is closed through the control circuit, and the MOS switching circuit is checked and repaired to eliminate the fault to ensure safety;
4. The converted current is monitored in real time through an ammeter to avoid damaging the subsequent circuit components caused by the converted current overload, so as to improve use stability of the subsequent equipments; a multimeter is used to detect the power polarity of the control circuit in real time to avoid subsequent power supply failure caused by reverse connection of the power supply.

DETAILED DESCRIPTION OF THE EMBODIMENTS

The following will further describe the present disclosure with reference to the accompanying drawings.

Figure 1:
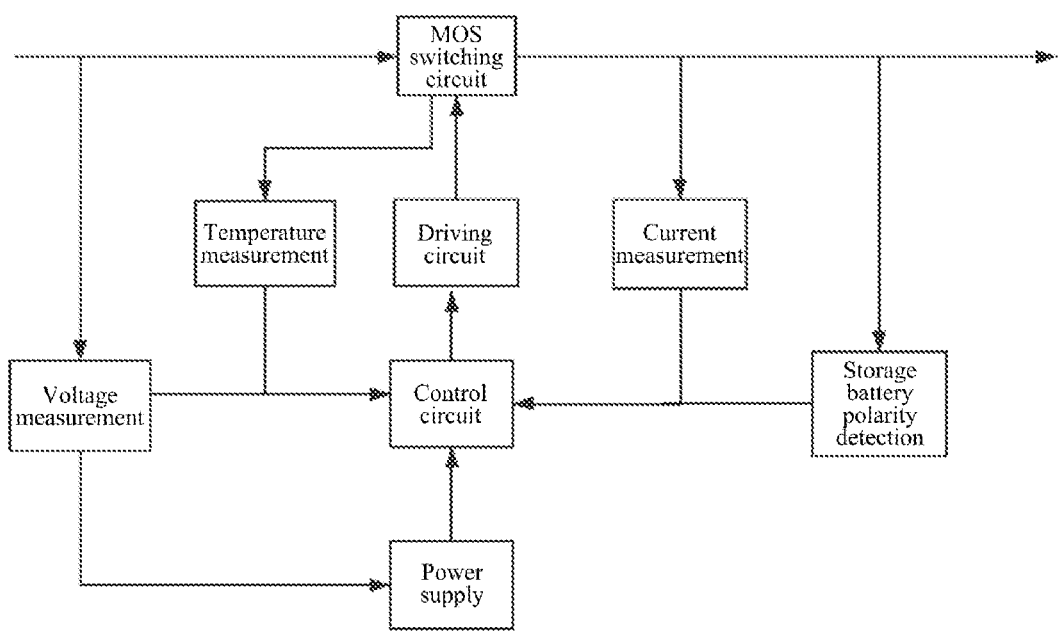
FIG. 1 is a schematic diagram of the overall flow in this embodiment.
Figure 2:
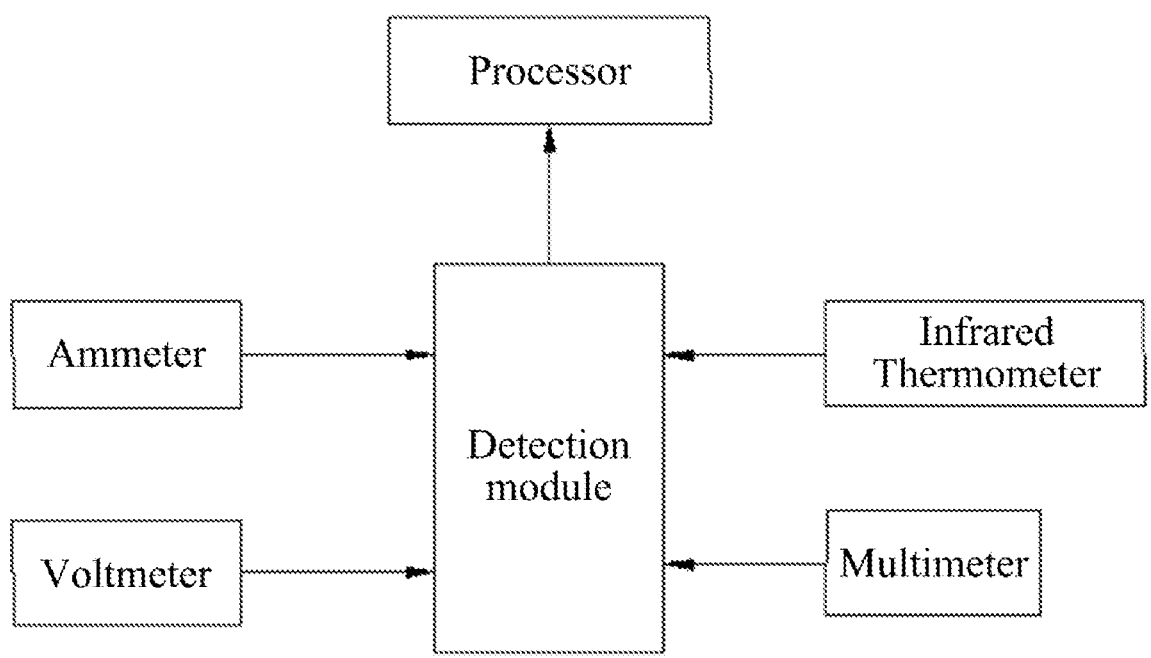
FIG. 2 is a connection diagram of the detection module in this embodiment.

As shown in FIG. 1 and FIG. 2, it is a large-current MOS drive control method in an preferred embodiment of the present disclosure, which comprises the following control procedures, including a detection module, a control module, and a display module;

As shown in FIG. 2, the detection module includes an ammeter, a voltmeter, a multimeter, and an infrared thermometer. The ammeter is used to monitor the current in the drive switch; the voltmeter is used to monitor the voltage entering the drive switch, select the corresponding control program; the multimeter monitors the battery polarity in the control circuit; the infrared thermometer monitors the temperature of the key connection points in the switching circuit. By the plurality of detection devices, the detection signals are collected and transmitted to the processor for signal processing, and the processed information is transmitted to the switching circuit;

The display module includes a display panel, and the display panel is provided with a red fault light and a green work light;
1. First turning on the device, initializing the device, activating the MOS switching circuit to make it in working state, turning on all the detection devices, and conducting a comprehensive monitoring of the switching circuit; at this time, after entering, there are red fault light and green work light on the display pane in flashing state; the red fault light and the green working light flash in turns to represent the search responsible state; the red fault light is turned off after 10 seconds, and the green working light is turned on to indicate the completion of the initialization operation, and completing the circuit opening operation;
2. First, monitoring the voltage connected to the switching circuit, the large-current MOS drives the control circuit (1000 A-3000 A); during the fault state, the LED connected to pin 28 needs to be set to high level to light up, and the I_ADC pin is checked again. If the detected value is greater than the current battery voltage, it means that there is fault, and the red fault light flashes. If the detected value is less than the value of the battery voltage, first turn on the TL1 advanced interrupt, and then turn on the ON/OFF pin. After they are turned on, if the TL1 interrupt is entered immediately, the ON/OFF will be turned off immediately in the interrupt and a fault alarm will be displayed. If the TL1 interrupt is not entered immediately, turn off the TL1 interrupt, and then check the ADC of the ILoad pin; if there is a value, turn on the green work light. If there is no value, turn off the ON/OFF, the red fault light and the green work light flash in turns, and execute again; if ILoad detects there is a value, judge the value; the value of this pin may exceed the detection range of the single-chip microcomputer. If it exceeds the range, the ADC value of the I_ADC pin can be detected, and it is not amplified (this value needs to be actually tested for current-limiting protection); after the switching circuit passes the voltage detection, it is connected to the power supply to activate the power supply, and the power supply supplies power;
3. The power supply described in step 2 is connected to the control circuit; the control circuit processes the information transmitted by the power supply, and the control circuit drives the driving circuit; the driving circuit is used to control the MOS switching circuit, through the MOS transistors arranged in the switching circuit, the multiple MOS transistors are connected in parallel for application, so that the large current is shared by the multiple MOS transistors, and the current borne by a single MOS transistor is relatively small, so that the high-voltage current can be converted to ensure device stability and improve use safety;
4. In step 3, after the MOS switching circuit is turned on, the temperature of the switching circuit is detected in real time by an infrared thermometer; if the temperature exceeds 80 degrees Celsius, giving an alarm by flashing a red alarm lamp and high temperature fault is displayed, and the signal is transmitted to the processor in the control circuit; the switching circuit is adjusted by the driving circuit to reduce the power, thereby detecting the temperature drop, which is used to protect the circuit and improve the safety. If the adjustment effect is not good, the high temperature failure persists, the MOS switching circuit is turned off by the control the circuit for maintenance and troubleshooting to ensure safety;
5. In step 3, after the large-current circuit is converted by the MOS switching circuit, the converted current is monitored in real time by the ammeter to avoid damaging the subsequent circuit elements caused by the converted current overload, and improve the use stability of the subsequent equipments.

6. In step 3, after the large-current circuit is converted by the MOS switching circuit, the MOS switching circuit is connected to the subsequent electrical equipment, and the power supply polarity of the control circuit is detected in real time by a multimeter to avoid subsequent power failure caused by reverse connection of the power supply.

The basic principles and main features of the present disclosure and the advantages of the present disclosure have been shown and described above. Those skilled in the art should understand that the present disclosure is not limited by the foregoing embodiments. The foregoing embodiments and specification only illustrate the principles of the present disclosure. Without departing from the spirit and scope of the present disclosure, various modifications and improvements may be performed on the present disclosure, which all fall within the scope of the invention sought for protection.

The protection scope of the present disclosure is defined by the appended claims and their equivalents.

The invention claimed is:

1. A MOS drive control method, comprising:
1} first turning on a device, initializing the device, activating an MOS switching circuit to make it in working state, turning on detection devices, and conducting a comprehensive monitoring of the switching circuit; at this time, after entering, there are a red fault light and a green work light on the display pane in a flashing state; the red fault light and the green working light flash in turn to represent a search responsible state; the red fault light is turned off after 10 seconds, and the green working light is turned on to indicate completion of the initialization operation, and finish a circuit opening operation;
2) first monitoring a voltage connected to the switching circuit, the MOS drives a control circuit, a current range is 1000A-3000A; after the switching circuit passes a voltage detection, it is connected to a power supply to activate the power supply;
3) the power supply described in step 2) is connected to the control circuit; the control circuit processes information transmitted by the power supply, and the control circuit drives a driving circuit;
4) in step 3), after the MOS switching circuit is turned on, a temperature of the switching circuit is detected in real time by an infrared thermometer; if the temperature exceeds 80 degrees Celsius, giving an alarm by flashing a red alarm lamp;
in operation step 2, during a fault state, an LED connected to a pin 28 lights up, and an I_ADC (activation current detection) pin is checked; if the detected voltage is greater than a current battery voltage, the red fault light flashes; if the detected value voltage is less than the battery voltage, first turning on an TL1 (top level hardware interrupt) advanced interrupt, and then turning on an ON/OFF pin; after they are turned on, if the TL1 interrupt is entered immediately, the ON/OFF will be turned off immediately in the TL1 interrupt and a fault alarm will be displayed; if the TL1 interrupt is not entered immediately, turning off the TL1 interrupt, and then checking an activation detection current of an ILoad (load current check) pin; if there is a current value, turning on the green work light; if there is no current value, turning off the ON/OFF, the red fault light and the green work light flash in turns, and returning to during the fault state, lighting up the LED connected to the pin 28 and checking the I_ADC pin again until-checking if there is a current value; if the ILoad detects there is a current value, judging the current value; if the current value of the ILoad pin exceeds the detection range of a single-chip microcomputer an activation detection current value of the I_ADC pin is detected.

2. The MOS drive control method according to claim 1, wherein in operation step 3, the driving circuit is used to control an MOS switching circuit, through MOS transistors arranged in the switching circuit, the multiple MOS transistors are connected in parallel for application.

3. The MOS drive control method according to claim 1, wherein in the operation step 4, the switching circuit is adjusted by the driving circuit to reduce power, thereby detecting temperature drop.

4. The MOS drive control method according to claim 1, wherein the step 3 comprises converting the circuit by a MOS switching circuit, and monitoring a converted current in real time by an ammeter.

5. The MOS drive control method according to claim 1, wherein step 3 comprises, controlling the circuit by the MOS switching circuit, connecting the MOS switching circuit to the subsequent electrical equipment, and detecting the power supply polarity of the control circuit in real time by a multimeter.

* * * * *